(12) United States Patent
Nishioka et al.

(10) Patent No.: US 10,833,484 B2
(45) Date of Patent: Nov. 10, 2020

(54) LIGHT EMITTING APPARATUS AND PROJECTOR

(71) Applicants: Seiko Epson Corporation, Tokyo (JP); Sophia School Corporation, Tokyo (JP)

(72) Inventors: Hiroki Nishioka, Kita (JP); Katsumi Kishino, Akiruno (JP)

(73) Assignees: Seiko Epson Corporation (JP); Sophia School Corporation (JP)

( * ) Notice: Subject to any disclaimer, the term of this patent is extended or adjusted under 35 U.S.C. 154(b) by 0 days.

(21) Appl. No.: 16/521,651

(22) Filed: Jul. 25, 2019

(65) Prior Publication Data

US 2020/0036163 A1 Jan. 30, 2020

(30) Foreign Application Priority Data

Jul. 26, 2018 (JP) .................................. 2018-140329

(51) Int. Cl.
*H01S 5/00* (2006.01)
*H01S 5/42* (2006.01)
*H01S 5/187* (2006.01)
*H01S 5/323* (2006.01)
*H01S 5/34* (2006.01)
(Continued)

(52) U.S. Cl.
CPC .............. *H01S 5/423* (2013.01); *H01S 5/105* (2013.01); *H01S 5/1067* (2013.01); *H01S 5/187* (2013.01); *H01S 5/323* (2013.01); *H01S 5/341* (2013.01); *H01S 5/3428* (2013.01);
(Continued)

(58) Field of Classification Search
CPC .......... H01S 5/187; H01S 5/105; H01S 5/323; H01S 5/341; H01S 5/3428; H01S 5/183; H01S 5/32341; H01S 5/34333; H01S 5/1067; H01S 5/4087; H01S 5/423
See application file for complete search history.

(56) References Cited

U.S. PATENT DOCUMENTS 5,638,393 A * 6/1997 Kovacs ................... B41J 2/473
347/238
9,774,172 B1 * 9/2017 Ayliffe ................ H01S 5/02252
(Continued)

FOREIGN PATENT DOCUMENTS

| JP | 2008-060433 A | 3/2008 |
|---|---|---|
| JP | 2009-054795 A | 3/2009 |
| JP | 2012-222001 A | 11/2012 |

OTHER PUBLICATIONS

M. Imada et al., "Coherent two-dimensional lasing action in surface-emitting laser with triangular-lattice photonic crystal structure", Applied Physics Letters, vol. 75, No. 3, pp. 316-318 (1999).
(Continued)

*Primary Examiner* — Kinam Park
(74) *Attorney, Agent, or Firm* — Harness, Dickey & Pierce, P.L.C.

(57) ABSTRACT

A light emitting apparatus including a plurality of first light emitters and a plurality of second light emitters that differ from the first light emitters in terms of resonance wavelength, in which the second light emitters are each disposed between each adjacent pair of the first light emitters, first light that resonates in the plurality of first light emitters is in phase, and second light that resonates in the plurality of second light emitters is in phase.

9 Claims, 12 Drawing Sheets

(51) Int. Cl.
*H01S 5/10* (2006.01)
*H01S 5/40* (2006.01)
H01S 5/183 (2006.01)
H01S 5/343 (2006.01)

(52) U.S. Cl.
CPC ............ *H01S 5/4087* (2013.01); *H01S 5/183* (2013.01); *H01S 5/32341* (2013.01); *H01S 5/34333* (2013.01)

(56) References Cited

U.S. PATENT DOCUMENTS

2008/0259969 A1* 10/2008 Piper .................... H01S 3/1086 372/3
2014/0219306 A1* 8/2014 Wright .................... H01S 5/10 372/45.012

OTHER PUBLICATIONS

Y. Liang et al., "Three-dimensional coupled-wave analysis for square-lattice photonic crystal surface emitting lasers with transverse-electric polarization: finite size effects", Optics Express, vol. 20, No. 14, pp. 15945-15961 (2012).
M. Imada et al., "Multidirectionally distributed feedback photonic crystal lasers", Physical Review B, vol. 65, 195306, 8 pages (2002).
M. De Zoyza et al., "Formation of holes in GaN by MOPVE for realization of photonic-crystal lasers", Proceedings of the 64th JSAP Spring Meeting, Yokohama, Japan, 15a-E205-8, 1 page (2017).

* cited by examiner

LIGHT EMITTING APPARATUS AND PROJECTOR

The present application is based on, and claims priority from, JP Application Serial Number 2018-140329, filed Jul. 26, 2018, the disclosure of which is hereby incorporated by reference herein in its entirety.

BACKGROUND

1. Technical Field

The present disclosure relates to a light emitting apparatus and a projector.

2. Related Art

A semiconductor laser is expected as a high-luminance, next-generation light source. Among a variety of semiconductor lasers, a semiconductor laser using nano-columns is expected to achieve high-power light emission at a small radiation angle based on a nano-column photonic crystal effect. Such a semiconductor laser is used, for example, as the light source of a projector.

Since the laser described above is a light source having high coherency, using the laser as the light source of a projector causes a problem of speckle noise. To reduce speckle noise, the coherency needs to be lowered.

For example, JP-A-2008-60433 describes a laser array which is formed of a plurality of laser devices arranged in an array and in which the laser devices each emit a laser beam having a wavelength different from the wavelength of the laser beam emitted from the nearest neighbor laser device. In the thus configured light emitting apparatus, which emits laser beams having different wavelengths, the coherency can be lowered, whereby the speckle noise can be reduced.

A light emitting apparatus capable of reducing speckle noise, such as that described in JP-A-2008-60433, is also required to output a light beam at a small radiation angle.

SUMMARY

A light emitting apparatus according to an aspect of the present disclosure includes a plurality of first light emitters and a plurality of second light emitters that differ from the first light emitters in terms of resonance wavelength. The second light emitters are each disposed between each adjacent pair of the first light emitters. First light that resonates in the plurality of first light emitters is in phase, and Second light that resonates in the plurality of second light emitters is in phase.

In the light emitting apparatus according to the aspect described above, the plurality of first light emitters may be arranged in directions in which the first light resonates in the first light emitters, and the plurality of second light emitters may be arranged in directions in which the second light resonates in the second light emitters.

In the light emitting apparatus according to the aspect described above, the first light emitters and the second light emitters may each include a light emission layer.

In the light emitting apparatus according to the aspect described above, the first light emitters may include a plurality of first structures, the plurality of first structures may be periodically arranged, the second light emitters may include a plurality of second structures, the plurality of second structures may be periodically arranged, and the first structures and the second structures may each be a columnar portion.

In the light emitting apparatus according to the aspect described above, the first light emitters may include a plurality of first structures, the plurality of first structures may be periodically arranged, the second light emitters may include a plurality of second structures, the plurality of second structures may be periodically arranged, and the first structures and the second structures may each be an opening.

In the light emitting apparatus according to the aspect described above, the plurality of first structures may be arranged in a regular triangular lattice, the plurality of second structures may be arranged in a regular triangular lattice, the plurality of first light emitters may be arranged in a regular triangular lattice, and the plurality of second light emitters may be arranged in a regular triangular lattice.

In the light emitting apparatus according to the aspect described above, the plurality of first structures may be arranged in a square lattice, the plurality of second structures may be arranged in a square lattice, the plurality of first light emitters may be arranged in a square lattice, and the plurality of second light emitters may be arranged in a square lattice.

In the light emitting apparatus according to the aspect described above, a distance between each adjacent pair of the first light emitters may be a distance that allows the light that resonates in one of the adjacent first light emitters to couple with the light that resonates in another of the adjacent first light emitters, and a distance between each adjacent pair of the second light emitters may be a distance that allows the light that resonates in one of the adjacent second light emitters to couple with the light that resonates in another of the adjacent second light emitters.

A projector according another aspect of the present disclosure includes any of the light emitting apparatuses described above.

DESCRIPTION OF EXEMPLARY EMBODIMENTS

Preferable embodiments of the present disclosure will be described below in detail with reference to the drawings. It is not intended that the embodiments described below unduly limit the contents of the present disclosure set forth in the appended claims. Further, all configurations described below are not necessarily essential configuration requirements of the present disclosure.

1. First Embodiment

1.1 Light Emitting Apparatus

Figure 1:
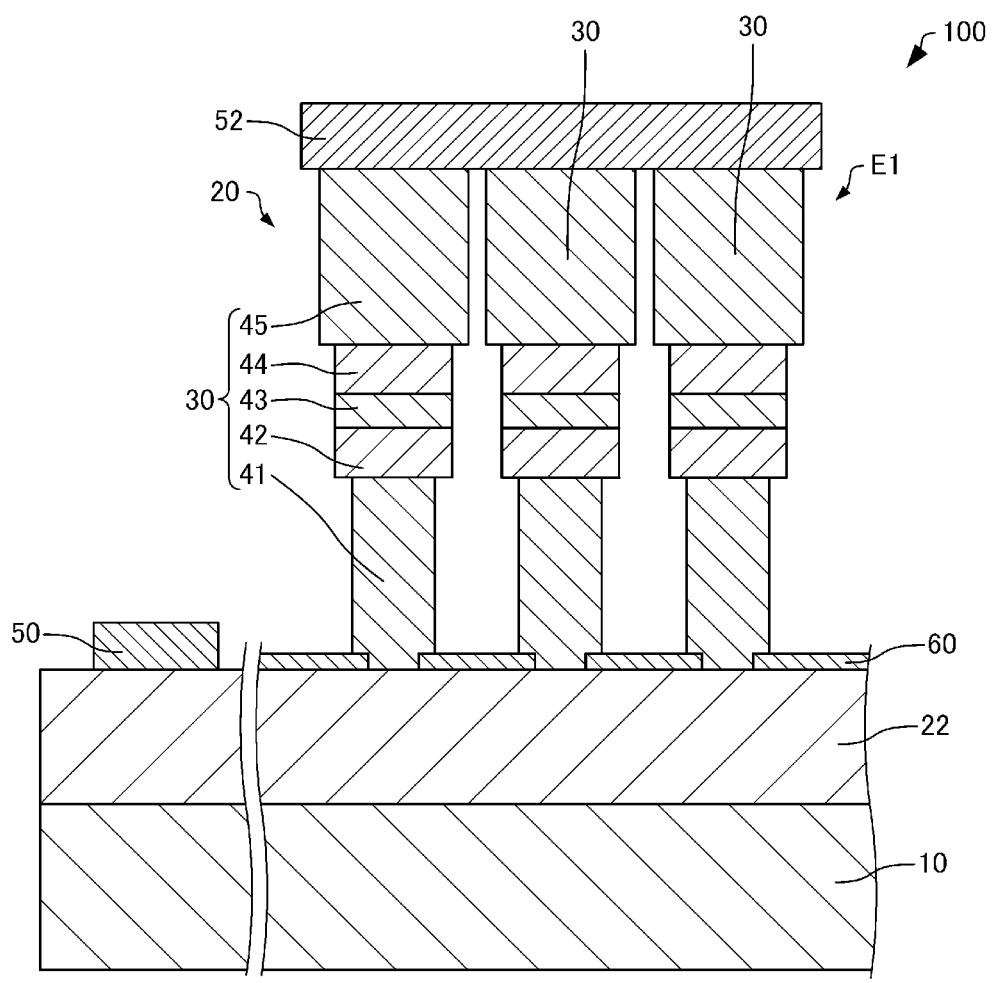
FIG. 1 is a cross-sectional view diagrammatically showing a light emitting apparatus according to a first embodiment.
Figure 2:
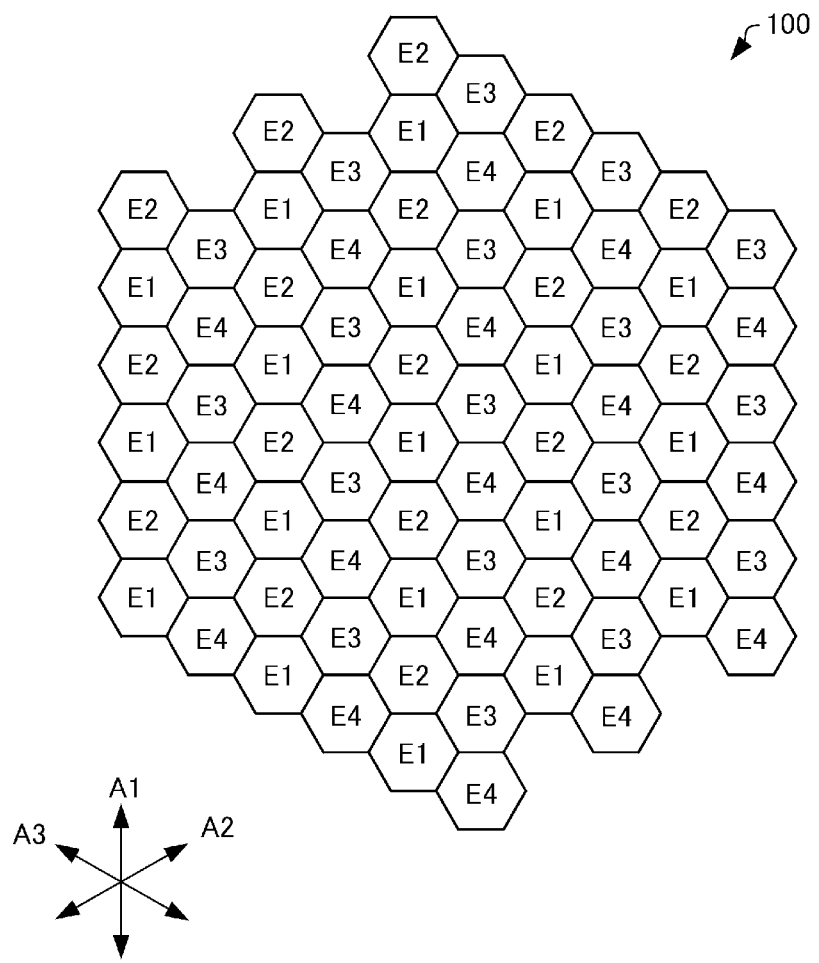
FIG. 2 is a plan view diagrammatically showing the light emitting apparatus according to the first embodiment.

A light emitting apparatus according to a first embodiment will first be described with reference to the drawings. FIG. 1 is a cross-sectional view diagrammatically showing a light emitting apparatus 100 according to the first embodiment. FIG. 2 is a plan view diagrammatically showing the light emitting apparatus 100 according to the first embodiment.

The light emitting apparatus 100 includes a plurality of first light emitters E1, a plurality of second light emitters E2, a plurality of third light emitters E3, a plurality of fourth light emitters E4, a first electrode 50, and a second electrode 52, as shown in FIGS. 1 and 2. In FIG. 2, the members excluding the first to fourth light emitters E1 to E4 are omitted for convenience.

The first light emitters E1 will first be described. FIG. 1 is a cross-sectional view diagrammatically showing the first light emitters E1 of the light emitting apparatus 100. The first light emitters E1 are each formed, for example, of a base 10 and a laminate 20.

The base 10 has, for example, a plate-like shape, as shown in FIG. 1. The base 10 is, for example, an Si substrate, a GaN substrate, or a sapphire substrate.

The laminate 20 is provided as part of the base 10. In the example shown in FIG. 1, the laminate 20 is provided on the base 10. The laminate 20 includes a buffer layer 22 and a first structure 30.

The buffer layer 22 is provided on the base 10. The buffer layer 22 is, for example, an n-type GaN layer to which Si is doped. A mask layer 60 for forming the first structure 30 is provided on the buffer layer 22.

In the present disclosure, the term "above" refers to a side in the lamination direction of the laminate 20 (hereinafter also simply referred to as "lamination direction") that is the side away from the base 10 when viewed from a light emission layer 43 of the first structure 30, and the term "below" refers to a side in the lamination direction that is the side closer to the base 10 when viewed from the light emission layers 43.

Further, in the present disclosure, the "lamination direction of the laminate 20" is the lamination direction in which a first semiconductor layer 41 and the light emission layer 43 of the first structure 30 are laminated on each other.

The first structure 30 is provided on the buffer layer 22. The first structure 30 is, for example, a columnar portion having a columnar shape. The cross-sectional shape of the first structure 30 in the direction perpendicular to the lamination direction is, for example, a regular hexagonal shape or any other polygonal shape or a circular shape. The radial length of the first structure 30 is, for example, on the order of nanometers, specifically, greater than or equal to 10 nm but smaller than or equal to 500 nm. The first structure 30 is also called, for example, a nano-column, a nano-wire, a nano-rod, or a nano-pillar. The size of the first structure 30 in the lamination direction is, for example, greater than or equal to 0.1 μm but smaller than or equal to 5 μm.

In the embodiments of the present disclosure, when the first structure 30 has a circular planar shape, the term "radial length" refers to the diameter, and when the first structure 30 has a polygonal planar shape, the term refers to the diameter of a minimum circle containing the polygonal shape therein, that is, a minimum inclusion circle. The term "planar shape" refers to the shape viewed along the lamination direction.

Figure 3:
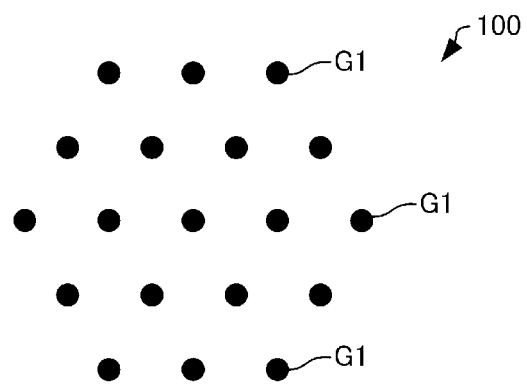
FIG. 3 diagrammatically shows lattice points at which first structures of the light emitting apparatus according to the first embodiment are disposed in a real space.
Figure 4:
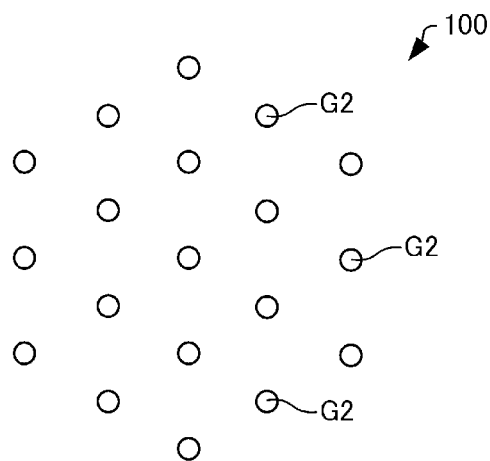
FIG. 4 diagrammatically shows reciprocal lattice points in a wave number space that correspond to the lattice points at which the first structures of the light emitting apparatus according to the first embodiment are disposed.
Figure 5:
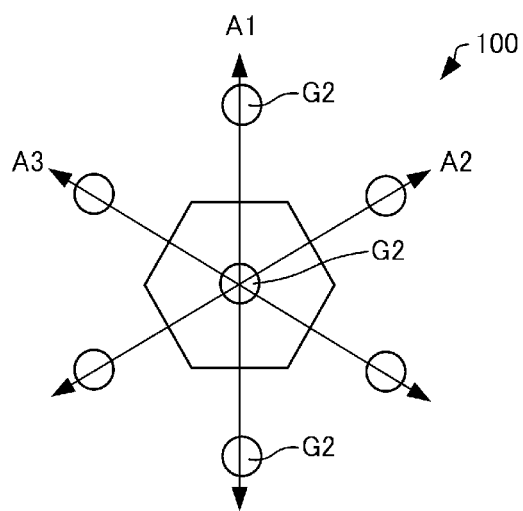
FIG. 5 is an enlarged view of part of FIG. 4.

The first structure 30 is formed of a plurality of first structures 30. The distance between adjacent first structures 30 is, for example, greater than or equal to 1 nm but smaller than or equal to 50 nm. FIG. 3 diagrammatically shows lattice points G1 at which the first structures 30 are arranged in a real space viewed along the lamination direction. FIG. 4 diagrammatically shows reciprocal lattice points G2 in a wave number space viewed along the lamination direction that correspond to the lattice points G1, where the first structures 30 are arranged. FIG. 5 is an enlarged view of the center and the vicinity of FIG. 4, and the regular hexagon in FIG. 5 represents a first Brillouin zone.

The lattice points G1 are periodically arranged, specifically arranged in a regular triangular lattice. That is, the plurality of first structures 30 are periodically arranged, specifically arranged in a regular triangular lattice. The plurality of first structures 30 can express a photonic crystal effect. Specifically, in a two-dimensional photonic crystal in which the first structures 30 are periodically arranged, a photonic band structure is formed. A light from the first photonic band edge in a Γ point in the photonic band structure resonates in a two-dimensional plane to produce a diffracted light in the off-plane vertical direction, whereby the photonic band structure can be used as a photonic crystal surface emitting laser. The arrows in FIG. 5 represent resonance directions in which the first light resonates in the first light emitters E1, that is, the resonance direction of a standing wave in the two-dimensional plane. In the case where the plurality of first structures 30 are arranged in a regular triangular lattice, the resonance directions are directions of a first axis A1, a second axis A2, and a third axis A3, which intersect one another at 60°.

The first structures 30 each include the first semiconductor layer 41, a first guide layer 42, the light emission layer 43, a second guide layer 44, and a second semiconductor layer 45, as shown in FIG. 1.

The first semiconductor layer 41 is provided on the buffer layer 22. The first semiconductor layer 41 is provided between the base 10 and the light emission layer 43. The first semiconductor layer 41 is, for example, an n-type GaN layer to which Si is doped.

The first guide layer 42 is provided on the first semiconductor layer 41. In the example shown in FIG. 1, the first guide layer 42 has a radial length greater than the radial length of the first semiconductor layer 41. The first guide layer 42 has, for example, a semiconductor super-lattice (SL) structure formed of a GaN layer and an InGaN layer. The number of GaN layers and InGaN layers that form the first guide layer 42 is not limited to a specific value.

The light emission layer 43 is provided on the first guide layer 42. The light emission layer 43 is provided between the first semiconductor layer 41 and the second semiconductor layer 45. In the example shown in FIG. 1, the radial length of the light emission layer 43 is equal to the radial length of the first guide layer 42. The light emission layer 43 is a layer capable of producing a light when current is injected thereinto. The light emission layer 43 has, for example, a multi quantum well (MQW) structure formed of a GaN layer and an InGaN layer. The number of GaN layers and InGaN layers that form the light emission layer 43 is not limited to a specific value.

The second guide layer 44 is provided on the light emission layer 43. In the example shown in FIG. 1, the radial length of the second guide layer 44 is equal to the radial length of the light emission layer 43. The second guide layer 44 has, for example, a semiconductor super-lattice (SL) structure formed of a GaN layer and an InGaN layer. The number of GaN layers and InGaN layers that form the second guide layer 44 is not limited to a specific value. The first guide layer 42 and the second guide layer 44 are each a layer having the function of increasing the amount of overlap between the light emission layer 43 and the light propagating in the direction perpendicular to the lamination direction, that is, increasing an optical confinement coefficient.

The second semiconductor layer 45 is provided on the second guide layer 44. The second semiconductor layer 45 is a layer having a conductivity type different from that of the first semiconductor layer 41. The second semiconductor layer 45 is, for example, a p-type GaN layer to which Mg is doped. The first semiconductor layer 41 and the second semiconductor layer 45 are each a cladding layer having the function of confining the light in the light emission layer 43.

The plurality of first light emitters E1 are arranged, for example, in a regular triangular lattice, as shown in FIG. 2. The plurality of first light emitters E1 are arranged in the resonance directions in which the first light resonates in the first light emitters E1. The resonance directions in which the first light resonates in the first light emitters E1 are the following three directions: the direction of the first axis A1; the direction of the second axis A2; and the direction of the third axis A3.

In the example shown in FIG. 1, any one of the second to fourth light emitters E2 to E4 is disposed between adjacent first light emitters E1. Specifically, a second light emitter E2 is disposed between first light emitters E1 adjacent to each other in the direction of the first axis A1. A third light emitter E3 is disposed between first light emitters E1 adjacent to each other in the direction of the second axis A2. A fourth light emitter E4 is disposed between first light emitters E1 adjacent to each other in the direction of the third axis A3.

The first light that resonates in the plurality of first light emitters E1 is in phase. That is, the distance between adjacent first light emitters E1 is the distance that allows the first light that resonates in one of the adjacent first light emitters E1 to couple with the first light that resonates in the other first light emitter E1. Therefore, in the light emitting apparatus 100, the plurality of first light emitters E1 arranged in the direction of the first axis A1 can form one standing wave. The same holds true for the plurality of first light emitters E1 arranged in the direction of the second axis A2 and the direction of the third axis A3. Specifically, the distance between adjacent first light emitters E1 is several tens of micrometers.

Figure 6:
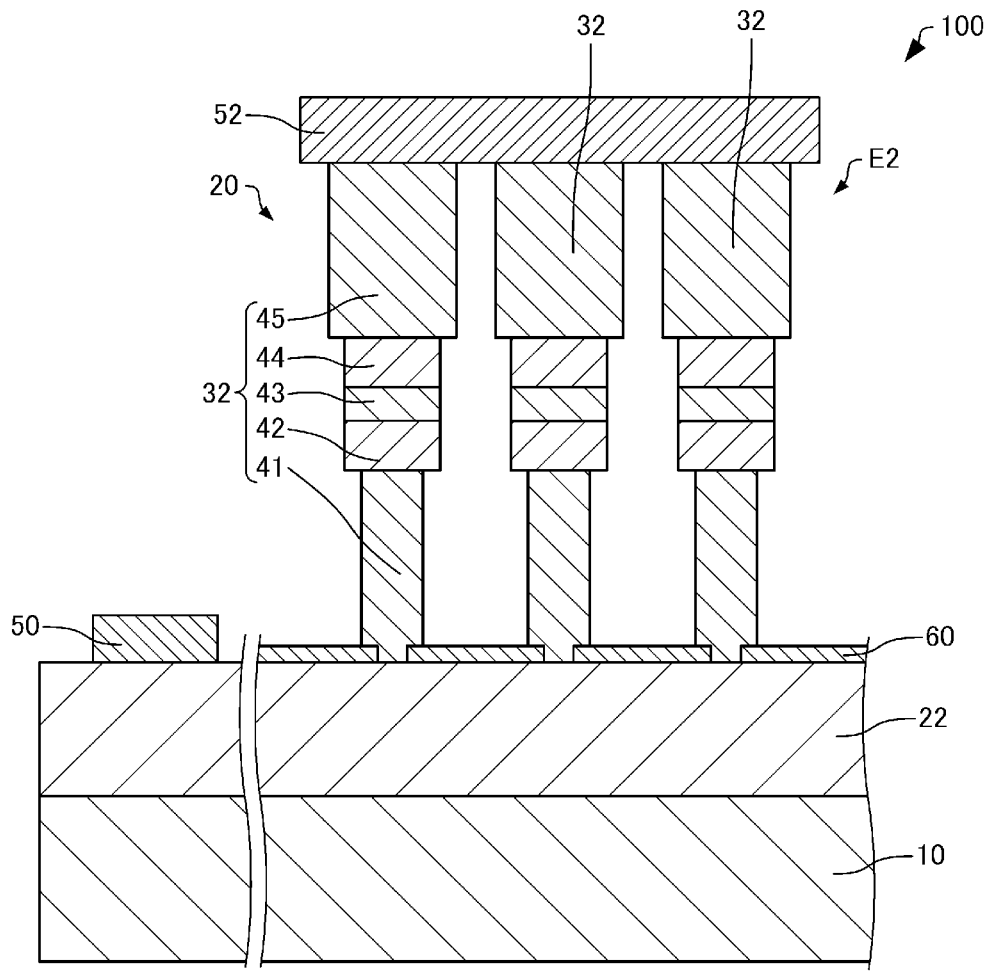
FIG. 6 is a cross-sectional view diagrammatically showing the light emitting apparatus according to the first embodiment.

The second light emitters E2 will next be described. FIG. 6 is a cross-sectional view diagrammatically showing the second light emitters E2. The second light emitters E2 each have a second structure 32 in place of the first structure 30 described above, as shown in FIG. 6. The second structure 32 is a columnar portion having a columnar shape. The radial length of the second structure 32 differs from the radial length of the first structure 30. The resonance wavelength provided by the second light emitters E2 therefore differs from the resonance wavelength provided by the first light emitters E1. In the example shown in FIG. 6, the radial length of the second structure 32 is smaller than the radial length of the first structure 30.

The second light emitters E2 are basically the same as the first light emitters E1 described above except that the resonance wavelength provided by the second light emitters E2 differs from the resonance wavelength provided by the first light emitters E1 because the second light emitters E2 each have the second structure 32.

For example, any one of the first, third, and fourth light emitters E1, E3, and E4 is disposed between adjacent second light emitters E2. The second light that resonates in the plurality of second light emitters E2 are in phase. The plurality of second light emitters E2 are arranged in the directions in which the second light resonates in the second light emitters E2. The plurality of second structures 32 are periodically arranged, specifically, arranged in a regular triangular lattice. The plurality of second light emitters E2 are arranged in a regular triangular lattice. The distance between adjacent second light emitters E2 is the distance that allows the second light that resonates in one of the adjacent second light emitter E2 to couple with the second light that resonates in the other second light emitter E2.

The above description has been made of the case where the first light emitters E1 and the second light emitters E2 differ from each other in terms of resonance wavelength because the first structures 30 and the second structures 32 differ from each other in terms of radial length thereof. The method for achieving different resonance wavelengths between the first light emitters E1 and the second light emitters E2 is not limited to a specific method, and the first structures 30 and the second structures 32 may be configured to differ from each other in terms of the cycle at which they are arranged or the refractive index thereof. It is, however, noted that the method for achieving different radial lengths between the first structures 30 and the second structures 32 is easy from the process point of view.

The third light emitters E3 will next be described. The third light emitters E3 are basically the same as the first light emitters E1 described above except that the third light emitters E3 differ from the first and second light emitters E1, E2 in terms of resonance wavelength. The third light emitters E3 differ from the first and second light emitters E1, E2 in terms of resonance wavelength, for example, because the third light emitters E3 each have a third structure having a radial length different from those of the first and second structures 30, 32. The third structure is a columnar portion having a columnar shape.

The fourth light emitters E4 will next be described. The fourth light emitters E4 are basically the same as the first light emitters E1 described above except that the fourth light emitters E4 differ from the first to third light emitters E1 to E3 in terms of resonance wavelength. The fourth light emitters E4 differ from the first to third light emitters E1 to E3 in terms of resonance wavelength, for example, because the fourth light emitters E4 each have a fourth structure having a radial length different from those of the first to third structures. The fourth structure is a columnar portion having a columnar shape.

The resonance wavelengths provided by the first to fourth light emitters E1 to E4 differ from one another, as described above. The resonance wavelengths provided by the first to fourth light emitters E1 to E4 differ from each other, for example, by several nanometers. For example, the resonance wavelength provided by the first light emitters E1 is 463 nm, the resonance wavelength provided by the second light emitters E2 is 462 nm, the resonance wavelength provided by the third light emitters E3 is 461 nm, and the resonance wavelength provided by the fourth light emitters E4 is 460 nm. The light emitting apparatus 100 can output, for example, light that belongs to a blue region.

The first to fourth light emitters E1 to E4 each have, for example, a regular hexagonal shape when viewed in the lamination direction, as shown in FIG. 2. In the example shown in FIG. 2, the first to fourth light emitters E1 to E4 have the same size when viewed in the lamination direction. Therefore, in the light emitting apparatus 100, the first to fourth light emitters E1 to E4 can be disposed in a close-packed arrangement in the directions of the first to third axes A1 to A3.

The distance between adjacent first light emitters E1, the distance between adjacent second light emitters E2, the distance between adjacent third light emitters E3, and the distance between adjacent fourth light emitters E4 are, for example, equal to one another. The total area of the plurality of first light emitters E1, the total area of the plurality of second light emitters E2, the total area of the plurality of third light emitters E3, and the total area of the plurality of fourth light emitters E4 viewed in the lamination direction are, for example, equal to one another. That is, the size of the entire region where the plurality of first light emitters E1 are disposed, the size of the entire region where the plurality of second light emitters E2 are disposed, the size of the entire region where the plurality of third light emitters E3 are disposed, and the size of the entire region where the plurality of fourth light emitters E4 are disposed are equal to one another. The light emitting apparatus 100 can therefore output different-wavelength light beams having the same intensity and radiation angle.

In general, the area of a light emitter viewed in the lamination direction is Fourier-transformed into the radiation angle of the light emitted from the light emitter and vice versa. That is, the near field pattern (NFP) is Fourier-transformed into the far field pattern (FFP) and vice versa. Therefore, when the lasing portion has a small area, the radiation angle increases, whereas the lasing portion has a large area, the radiation angle decreases.

In the light emitting apparatus 100, each set of the p-type second semiconductor layer 45, the light emission layer 43 and the first and second guide layers 42 and 44, to which no impurity is doped, and the n-type first semiconductor layer 41 form a pin diode. In the light emitting apparatus 100, when forward bias voltage for the pin diode is applied to the space between the first electrode 50 and the second electrode 52, current is injected into the light emission layers 43, whereby electrons and holes recombine with each other in the light emission layers 43. The recombination causes light emission. The light produced in each of the light emission layers 43 propagates in the direction perpendicular to the lamination direction via the first semiconductor layer 41 and the second semiconductor layer 42 and forms a standing wave, for example, in the first light emitter E1 based on the photonic crystal effect provided by the corresponding one of the plurality of first structures 30, and the gain in the light emission layer 43 causes laser oscillation. The light emitting apparatus 100 then output positive first order diffracted light and negative first order diffracted light as laser beams in the lamination direction.

In the light emitting apparatus 100, the first to fourth light emitters E1 to E4 each form a standing wave and differ from one another in terms of resonance wavelength, as described above. The first to fourth light emitters E1 to E4 can therefore output light beams having different wavelengths.

Although not shown, a reflection layer may be provided between the base 10 and the buffer layer 22 or below the base 10. The reflection layer is, for example, a distributed Bragg reflector (DBR) layer. The reflection layer can reflect the light beams produced in the light emission layers 43, and the light emitting apparatus 100 can output the light beams only via the second electrode 52. Further, high power can be achieved.

The first electrode 50 is provided on the buffer layer 22, as shown in FIG. 1. The buffer layer 22 may be in ohmic contact with the first electrode 50. The first electrode 50 is electrically connected to the first semiconductor layers 41. In the example shown in FIG. 1, the first electrode 50 is electrically connected to the first semiconductor layers 41 via the buffer layer 22. The first electrode 50 is one of the electrodes for injecting the current into the light emission layers 43. The first electrode 50 is, for example, a laminate of a Ti layer, an Al layer, and an Au layer laminated in the presented order on the buffer layer 22. Although not shown, when the base 10 is electrically conductive, the first electrode 50 may be provided below the base 10.

The second electrode 52 is provided on the second semiconductor layers 45. The second semiconductor layers 45 may be in ohmic contact with the second electrode 52. The second electrode 52 is electrically connected to the second semiconductor layers 45. The second electrode 52 is the other one of the electrodes for injecting the current into the light emission layers 43. The second electrode 52 is made, for example, of an indium tin oxide (ITO).

The InGaN-based light emission layers 43 have been described above, and the light emission layers 43 according to the embodiment of the present disclosure can be made of any material capable of emitting light when current is injected thereto. Examples of the material may include an AlGaN-based material, an AlGaAs-based material, an InGaAs-based material, an InGaAsP-based material, an In—P-based material, a GaP-based material, an AlGaP-based material, and other semiconductor materials.

The light emitting apparatus 100 has, for example, the following features.

The light emitting apparatus 100 includes the plurality of first light emitters E1 and the plurality of second light emitters E2, which emit light having a resonance wavelength different from that of the light from the first light emitters E1. The second light emitters E2 are each disposed between adjacent first light emitters E1. The first light that resonates in the plurality of first light emitters E1 is in phase, and the second light that resonates in the plurality of second light emitters E2 is in phase.

The light emitting apparatus 100 can therefore output light beams having different wavelengths from the first light emitters E1 and the second light emitters E2. The light emitting apparatus 100 can therefore be a wide-band light emitting apparatus and can lower the coherency as compared with a light emitting apparatus outputs a light beam having only type of wavelength. As a result, speckle noise can be reduced.

Further, in the light emitting apparatus 100, the first light that resonate in the plurality of first light emitters E1 is in phase with one another, and the first light that resonate in the plurality of second light emitters E2 is in phase. Therefore, in adjacent first light emitters E1, the first light that resonates in one of the adjacent first light emitters E1 can couple with the first light that resonates in the other one of the adjacent first light emitters E1, whereby the plurality of first light emitters E1 as a whole can be a resonance region that forms one standing wave. The same holds true for the second light emitters E2. The light emitting apparatus 100 therefore allows a decrease in the radiation angle of the light outputted therefrom as compared with a case where the light that resonates in one of adjacent light emitters does not couple with the light that resonates in the other one of the adjacent light emitters. As a result, for example, when the light emitting apparatus 100 is used as the light source of a projector, the size of a downstream lens can be reduced.

As described above, the light emitting apparatus 100 allows reduction in speckle noise and can output a light beam having a small radiation angle.

Figure 7:
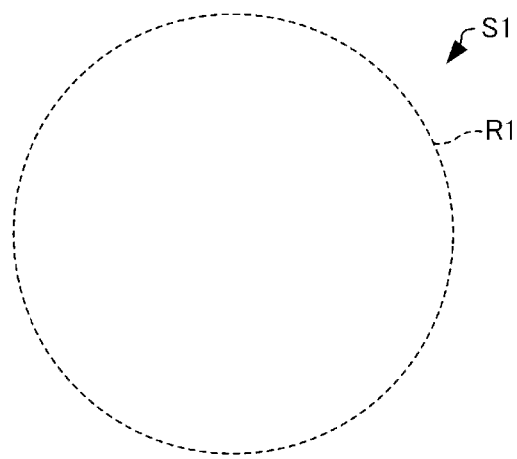
FIG. 7 describes a resonance region of a light emitting apparatus according to Reference Example 1.
Figure 8:
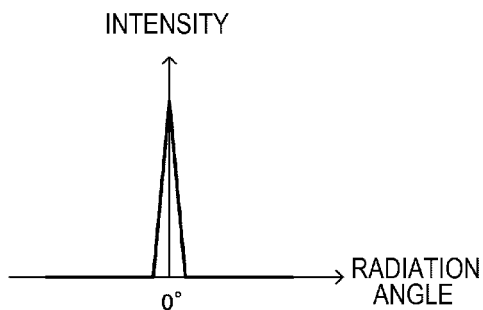
FIG. 8 describes the radiation angle of the light beam outputted from the light emitting apparatus according to Reference Example 1.
Figure 9:
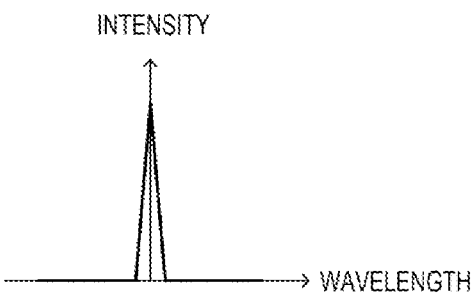
FIG. 9 describes the wavelength of the light beam outputted from the light emitting apparatus according to Reference Example 1.
Figure 10:
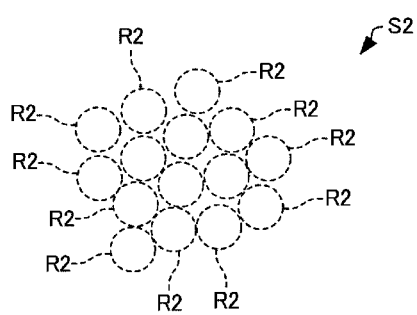
FIG. 10 describes resonance regions of a light emitting apparatus according to Reference Example 2.
Figure 11:
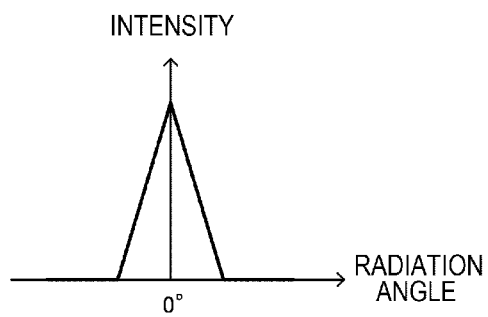
FIG. 11 describes the radiation angle of the light beam outputted from the light emitting apparatus according to Reference Example 2.
Figure 12:
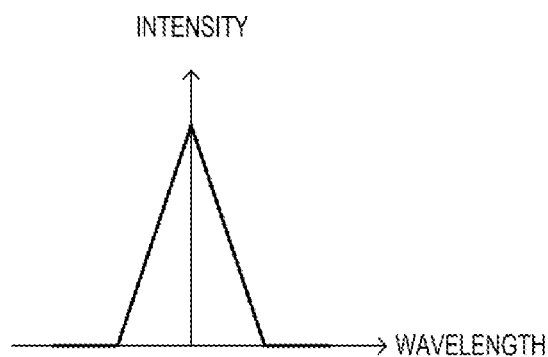
FIG. 12 describes the wavelength of the light beam outputted from the light emitting apparatus according to Reference Example 2.
Figure 13:
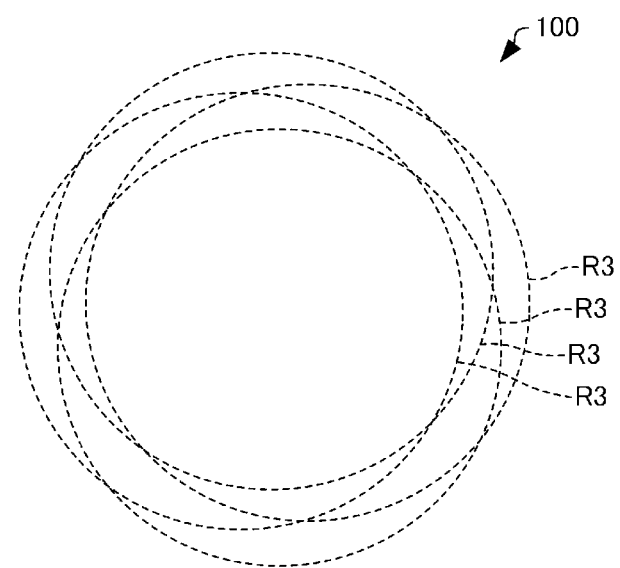
FIG. 13 describes resonance regions of the light emitting apparatus according to the first embodiment.
Figure 14:
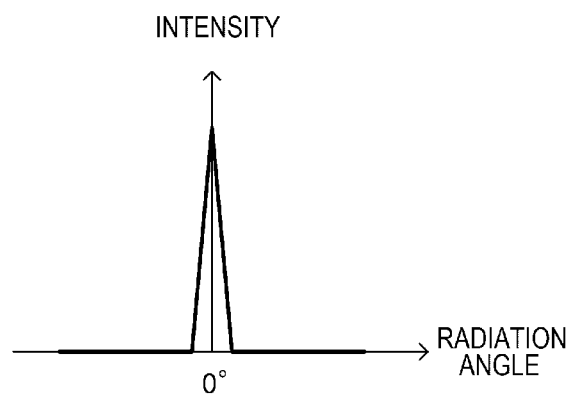
FIG. 14 describes the radiation angle of the light beam outputted from the light emitting apparatus according to the first embodiment.
Figure 15:
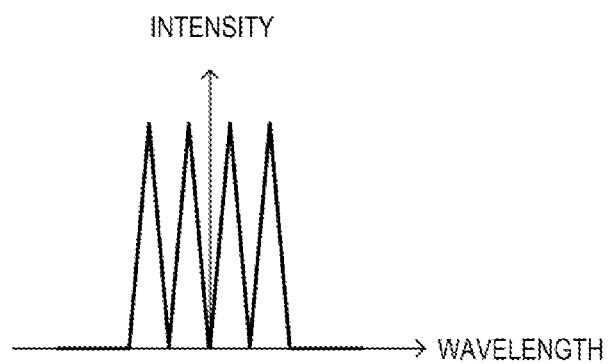
FIG. 15 describes the wavelength of the light beam outputted from the light emitting apparatus according to the first embodiment.

FIG. 7 describes a resonance region R1 of a light emitting apparatus S1 according to Reference Example 1. FIG. 8 describes the radiation angle of the light beam outputted from the light emitting apparatus S1 according to Reference Example 1. FIG. 9 describes the wavelength of the light beam outputted from the light emitting apparatus S1 according to Reference Example 1. FIG. 10 describes resonance regions R2 of a light emitting apparatus S2 according to Reference Example 2. FIG. 11 describes the radiation angle of the light beam outputted from the light emitting apparatus S2 according to Reference Example 2. FIG. 12 describes the wavelength of the light beam outputted from the light emitting apparatus S2 according to Reference Example 2. FIG. 13 describes resonance regions R3 of the light emitting apparatus 100. FIG. 14 describes the radiation angle of the light beam outputted from the light emitting apparatus 100. FIG. 15 describes the wavelength of the light beam outputted from the light emitting apparatus 100.

In FIGS. 7, 10, and 13, the resonance regions R1, R2, and R3 are each drawn in the form of a circle for convenience. In FIGS. 8, 11, and 14, the horizontal axis represents the radiation angle, and the vertical axis represents the intensity of the light beam. In FIGS. 9, 12, and 15, the horizontal axis represents the wavelength, and the vertical axis represents the intensity of the light beam. That is, FIGS. 9, 12, and 15 each show the spectrum of the light beam.

As shown in FIG. 7, the resonance region R1 of the light emitting apparatus S1 has an area greater than the area of each of the resonance regions R2 of the light emitting apparatus S2 shown in FIG. 10. The radiation angle of the light beam outputted from the light emitting apparatus S1 therefore decreases, as shown in FIG. 8. However, since the light emitting apparatus S1 outputs a light beam having one wavelength, the light beam outputted from the light emitting apparatus S1 has high coherency, as shown in FIG. 9, is therefore likely to produce speckle noise.

The light emitting apparatus S2 has a plurality of resonance regions, as shown in FIG. 10, and can therefore output a light beam having four wavelengths. The light beam outputted from the light emitting apparatus S2 therefore have low coherency, as shown in FIG. 12, whereby the speckle noise can be reduced. However, since the area of each of the resonance regions R2 of the light emitting apparatus S2 is smaller than the area of the resonance region R1 of the light emitting apparatus S1, the radiation angle of the light beam outputted from the light emitting apparatus S2 increases, as shown in FIG. 11.

In the light emitting apparatus 100, the plurality of first light emitters E1 as a whole can form one resonance region R3, where the light beam having a predetermined wavelength resonates. Therefore, for example, four resonance regions R3, which are greater than the resonance regions R2 of the light emitting apparatus S2, can be provided, as shown in FIG. 13. As a result, the radiation angle of the outputted light beam can be reduced, as shown in FIG. 14, and the coherency can be lowered, as shown in FIG. 15, and the speckle noise can therefore be reduced.

In the light emitting apparatus 100, the plurality of first light emitters E1 are arranged in the resonance directions in which the first light resonates in the first light emitters E1, and the plurality of second light emitters E2 are arranged in the resonance directions in which the second light resonates in the second light emitters E2. Therefore, in adjacent first light emitters E1 of the light emitting apparatus 100, the first light that resonates in one of the adjacent first light emitters E1 can couple with the first light that resonates in the other one of the adjacent first light emitters E1. Similarly, in adjacent second light emitters E2, the second light that resonates in one of the adjacent second light emitters E2 can couple with the second light that resonates in the other one of the adjacent second light emitters E2.

In the light emitting apparatus 100, the first light emitters E1 and the second light emitters E2 each include the light emission layer 43. The first light emitters E1 and the second light emitters E2 can therefore each produce light in the light emission layer 43.

In the light emitting apparatus 100, the first light emitters E1 has a plurality of first structures 30, the plurality of first structure 30 are periodically arranged, the second light emitters E2 has a plurality of second structures 32, the plurality of second structure 32 are periodically arranged, and the first structures 30 and the second structures 32 are each a columnar portion. Therefore, in the light emitting apparatus 100, an upper portion of each of the first structures 30 and the second structures 32 has low defect density, and stain is relaxed in the upper portion of each of the first structures 30 and the second structures 32.

In the light emitting apparatus 100, the plurality of first structures 30 are arranged in a regular triangular lattice and so are the plurality of second structures 32, and the plurality of first light emitters E1 are arranged in a regular triangular lattice and so are the plurality of second light emitters E2. In the light emitting apparatus 100, in which the plurality of first structures 30 are arranged in a regular triangular lattice, the resonance directions in the first light emitters E1 can be the directions of the first to third axes A1 to A3, which intersect one another at 60°. Further, since the plurality of first light emitters E1 are arranged in a regular triangular lattice, the first light emitters E1 can be isotropically disposed in the three resonance directions. Therefore, since a resonator that operates equally for the light that resonates in the three directions can be manufactured, whereby the light confinement per resonance region area can be maximized. The same holds true for the second structures 32 and the second light emitters E2.

In the light emitting apparatus 100, the distance between adjacent first light emitters E1 is the distance that allows the first light that resonates in one of the adjacent first light emitters E1 to couple with the first light that resonates in the other one of the adjacent first light emitters E1, and the distance between adjacent second light emitters E2 is the distance that allows the second light that resonates in one of the adjacent second light emitters E2 to couple with the second light that resonates in the other one of the adjacent second light emitters E2. Therefore, in the light emitting apparatus 100, the first light that resonates in the plurality of first light emitters E1 can be in phase, and the second light that resonate in the plurality of second light emitters E2 can be in phase.

1.2 Method for Manufacturing Light Emitting Apparatus

Figure 16:
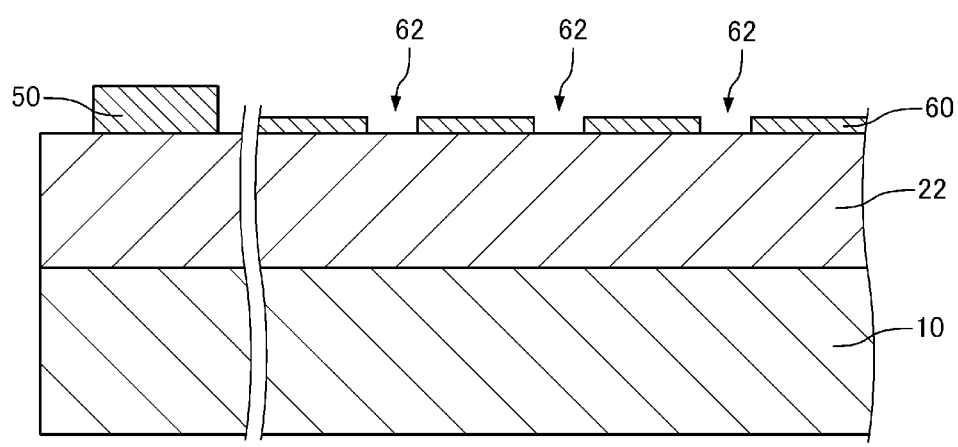
FIG. 16 is a cross-sectional view diagrammatically showing one of the steps of manufacturing the light emitting apparatus according to the first embodiment.

A method for manufacturing the light emitting apparatus 100 according to the first embodiment will next be described with reference to the drawings. FIG. 16 is a cross-sectional view diagrammatically showing one of the steps of manufacturing the light emitting apparatus 100 according to the first embodiment.

The buffer layer 22 is epitaxially grown on the base 10, as shown in FIG. 16. Examples of the epitaxial growth may include metal organic chemical vapor deposition (MOCVD) and molecular beam epitaxy (MBE).

The mask layer 60 is then formed on the buffer layer 22. The mask layer 60 is formed, for example, by patterning using electron beam evaporation, plasma chemical vapor deposition (CVD), or any other film formation method in conjunction with photolithography and etching technologies. In each of the first to fourth light emitters E1 to E4, the area of an opening 62 in the mask layer 60 for forming a columnar portion is so set as to differ from the areas in the other light emitters viewed in the lamination direction. The radial lengths of the columnar portions in the first to fourth light emitters E1 to E4 can thus differ from one another.

The first semiconductor layers 41, the first guide layers 42, the light emission layers 43, the second guide layers 44, and the second semiconductor layers 45 are epitaxially grown in the presented order on the buffer layer 22 with the mask layer 60 serving as a mask, as shown in FIG. 1. Examples of the epitaxial growth may include MOCVD and MBE. The columnar portions can be formed in the steps described above. That is, the first structures 30 of the first light emitters E1, the second structures 32 of the second light emitters E2, the third structures of the third light emitters E2, and the fourth structures of the fourth light emitters E4 can be formed.

Thereafter, the first electrode 50 is formed on the buffer layer 22, and the second electrode 52 is formed on the second semiconductor layers 45. The first electrode 50 and the second electrode 52 are formed, for example, in vacuum evaporation. The order in which the first electrode 50 and the second electrode 52 are formed is not limited to a specific order.

The light emitting apparatus 100 can be manufactured in the steps described above.

1.3 Variations of Light Emitting Apparatus 1.3.1 First Variation

Figure 17:
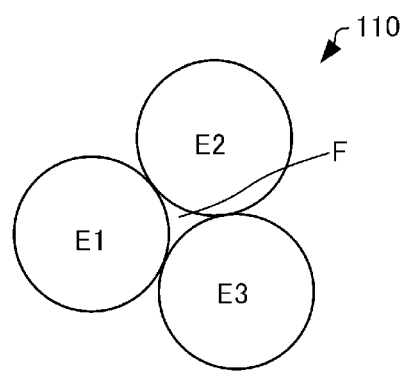
FIG. 17 is a plan view diagrammatically showing a light emitting apparatus according to a first variation of the first embodiment.

A light emitting apparatus according to a first variation of the first embodiment will next be described with reference to the drawings. FIG. 17 is a plan view diagrammatically showing a light emitting apparatus 110 according to the first variation of the first embodiment.

The light emitting apparatus 110 according to the first variation of the first embodiment will be described below in terms of points different from those of the light emitting apparatus 100 according to the first embodiment described above, and the same points will not be described. The same holds true for light emitting apparatuses according to second and third variations of the first embodiment shown below.

In the light emitting apparatus 100 described above, the first to fourth light emitters E1 to E4 each have a regular hexagonal shape when viewed in the lamination direction, as shown in FIG. 2. In contrast, in the light emitting apparatus 110, the first to fourth light emitters E1 to E4 each have a circular shape when viewed in the lamination direction, as shown in FIG. 17. FIG. 17 shows one set of the first to third light emitters E1 to E3 for convenience.

In the light emitting apparatus 110, for example, a plurality of columnar portions are provided in the region surrounded by the first to fourth light emitters E1 to E4, specifically, a region F surrounded by the first to third light emitters E1 to E3 in the example shown in FIG. 17 when viewed in the lamination direction.

The radial length of each of the columnar portions provided in the region F differs, for example, from the radial length of each of the columnar portions of the first to fourth light emitters E1 to E4. For example, in the region F surrounded by the first to third light emitters E1 to E3, the radial length of each of the columnar portions in the region F may approach the radial length of the columnar portion of the first light emitter E1 with distance to the first light emitter E1. Similarly, the radial length of each of the columnar portions in the region F may approach the radial length of the columnar portion of the second light emitter E2 with distance to the second light emitter E2 in the region F. Further, the radial length of each of the columnar portions in the region F may approach the radial length of the columnar portion of the third light emitter E3 with distance to the third light emitter E3 in the region F. As a result, in the light emitting apparatus 110, the effect of the interfaces between the regions on the resonance wavelength can be lowered.

When the resonance wavelengths provided by the first to fourth light emitters E1 to E4 are caused to differ from one another by changing the cycle at the columnar portions are arranged, the cycle of the columnar portions in the region F may approach the cycle of the columnar portions of the first light emitters E1 with distance to the first light emitters E1 in the region F.

1.3.2 Second Variation

Figure 18:
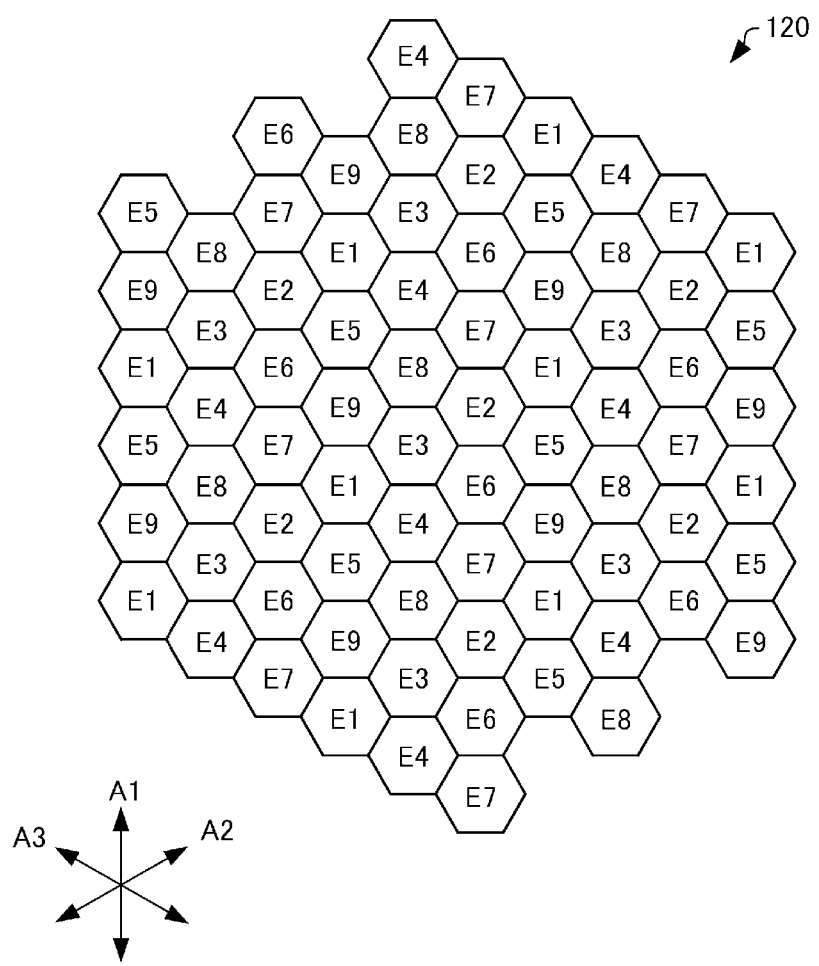
FIG. 18 is a plan view diagrammatically showing a light emitting apparatus according to a second variation of the first embodiment.

A light emitting apparatus according to a second variation of the first embodiment will next be described with reference to the drawings. FIG. 18 is a plan view diagrammatically showing a light emitting apparatus 120 according to the second variation of the first embodiment.

In the light emitting apparatus 100 described above, only any one of the second to fourth light emitters E2 to E4 is disposed between adjacent first light emitters E1 when viewed in the lamination direction, as shown in FIG. 2. Specifically, one second light emitter E2 is disposed between first light emitters E1 adjacent to each other in the direction of the first axis A1. One third light emitter E3 is disposed between first light emitters E1 adjacent to each other in the direction of the second axis A2. One fourth light emitter E4 is disposed between first light emitters E1 adjacent to each other in the direction of the third axis A3.

In contrast, in the light emitting apparatus 120, two of the second to ninth light emitters E2 to E9 are disposed between adjacent first light emitters E1 when viewed in the lamination direction, as shown in FIG. 18. Specifically, a fifth light emitter E5 and a ninth light emitter E9 are disposed between first light emitters E1 adjacent to each other in the direction of the first axis A1. A second light emitter E2 and a third light emitter E3 are disposed between first light emitters E1 adjacent to each other in the direction of the second axis A2. A fourth light emitter E4 and a seventh light emitter E7 are disposed between first light emitters E1 adjacent to each other in the direction of the third axis A3.

The light emitting apparatus 120 includes fifth to ninth light emitters E5 to E9 as well as the first to fourth light emitters E1 to E4. The first to ninth light emitters E1 to E9 differ from one another in terms of resonance wavelength. The fifth to ninth light emitters E5 to E9 are basically the same as the first light emitters E1 described above except that the fifth to ninth light emitters E5 to E9 differ from the first light emitters E1 in terms of resonance wavelength due, for example, to differences in the radial length of the columnar portions.

The light emitting apparatus 120, which includes the first to ninth light emitters E1 to E9, allows a further decrease in coherency and in turn further reduction in speckle noise as compared with the light emitting apparatus 100. In any the light emitting apparatuses according to the embodiment of the present disclosure, the number of light emitters is not limited to a specific value as long as a plurality of light emitters are provided.

1.3.3 Third Variation

Figure 19:
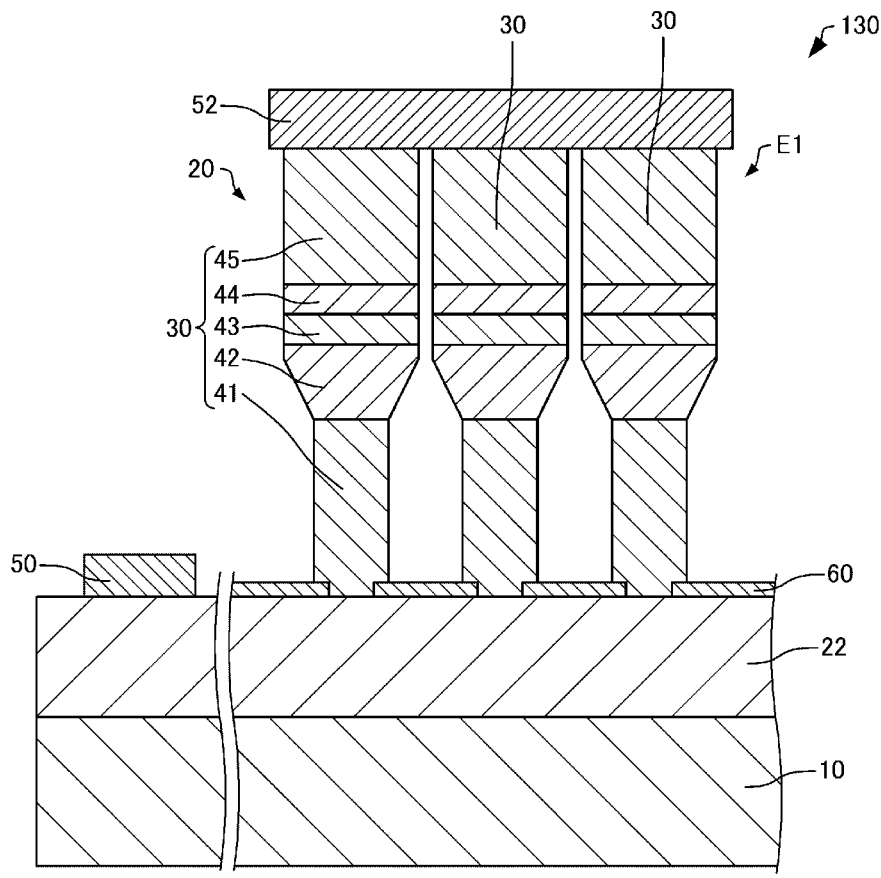
FIG. 19 is a cross-sectional view diagrammatically showing a light emitting apparatus according to a third variation of the first embodiment.

A light emitting apparatus according to a third variation of the first embodiment will next be described with reference to the drawings. FIG. 19 is a cross-sectional view diagrammatically showing a light emitting apparatus 130 according to the third variation of the first embodiment.

In the light emitting apparatus 100 described above, the radial length of each of the second semiconductor layers 45 is greater than the radial length of each of the light emission layers 43, as shown in FIG. 1. In contrast, in the light emitting apparatus 130, the radial length of each of the second semiconductor layers 45 is equal to the radial length of each of the light emission layers 43, as shown in FIG. 19. In the example shown in FIG. 19, the radial length of each of the first guide layers 42 changes in the lamination direction. The radial length of each of the second guide layers 44 is equal to the radial length of each of the light emission layers 43.

For example, adjusting the growth temperatures at which the first guide layers 42, the light emission layers 43, the second guide layers 44, and the second semiconductor layers 45 are epitaxially grown allows the radial length of the first guide layers 42 to change in the lamination direction and the radial length of the second semiconductor layers 45 to be equal to the radial length of the light emission layers 43 and the radial length of the second guide layers 44.

2. Second Embodiment

2.1 Light Emitting Apparatus

Figure 20:
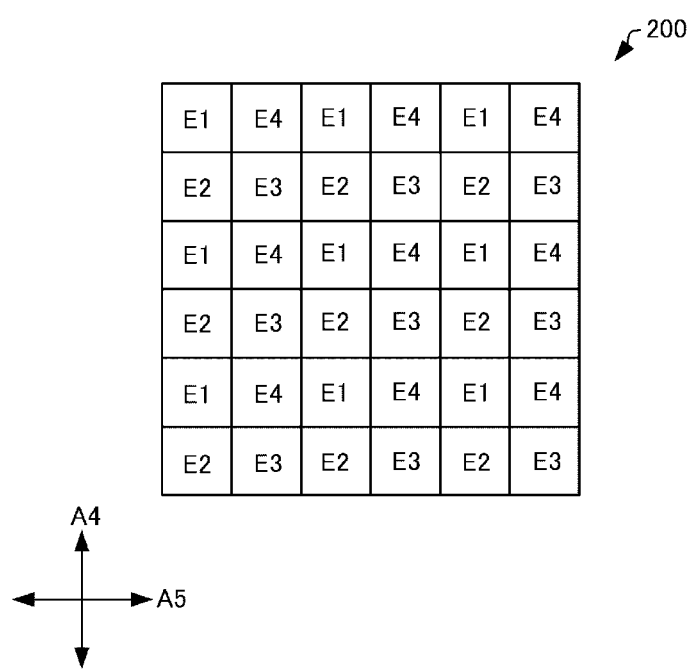
FIG. 20 is a plan view diagrammatically showing a light emitting apparatus according to a second embodiment.
Figure 21:
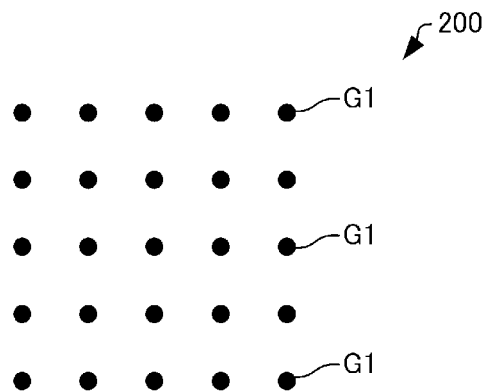
FIG. 21 diagrammatically shows lattice points at which first structures of the light emitting apparatus according to the second embodiment are disposed in a real space.
Figure 22:
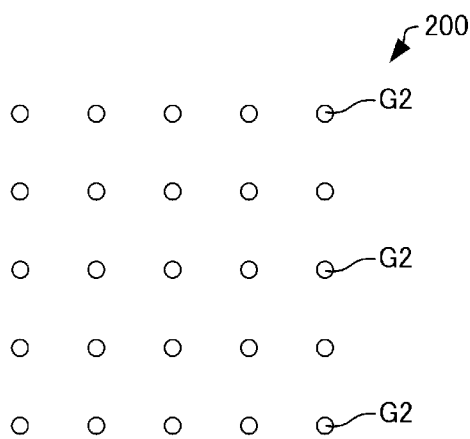
FIG. 22 diagrammatically shows reciprocal lattice points in a wave number space that correspond to the lattice points at which the first structures of the light emitting apparatus according to the second embodiment are disposed.
Figure 23:
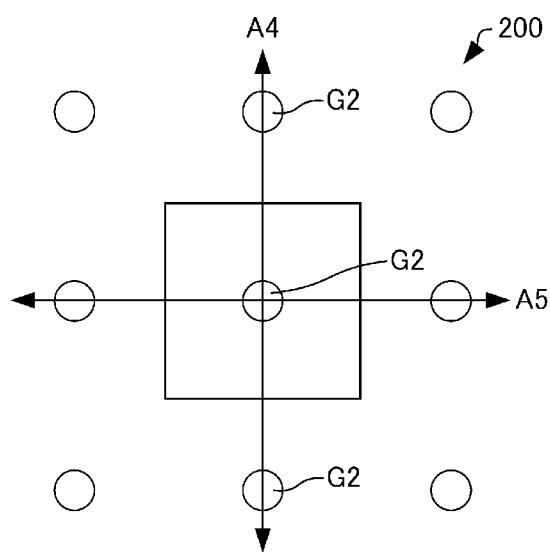
FIG. 23 is an enlarged view of part of FIG. 22.

A light emitting apparatus according to a second embodiment will next be described with reference to the drawings. FIG. 20 is a plan view diagrammatically showing a light emitting apparatus 200 according to the second embodiment. FIG. 21 diagrammatically shows the lattice points G1 in a real space at which the first structures 30 of the light emitting apparatus 200 according to the second embodiment are disposed. FIG. 22 diagrammatically shows the reciprocal lattice points G2 in a wave number space that correspond to the lattice points G1, where the first structures 30 of the light emitting apparatus 200 according to the second embodiment are arranged. FIG. 23 is an enlarged view of the center and the vicinity of FIG. 22, and the square in FIG. 23 represents a first Brillouin zone. In FIG. 20, the members other than the first to fourth light emitters E1 to E4 are omitted for convenience.

The light emitting apparatus 200 according to the second embodiment will be described below in terms of points different from those of the light emitting apparatus 100 according to the first embodiment described above, and the same points will not be described.

In the light emitting apparatus 100 described above, the plurality of first light emitters E1 are arranged in a regular triangular lattice, as shown in FIG. 2. Further, in the light emitting apparatus 100, the lattice points G1, at which the first structures 30 are disposed, are arranged in a regular triangular lattice, as shown in FIG. 3.

In contrast, in the light emitting apparatus 200, the plurality of first light emitters E1 are arranged in a square lattice, as shown in FIG. 20. Similarly, the plurality of second light emitters E2 are arranged in a square lattice. The same holds true for the third light emitters E3 and the fourth light emitters E4. The first to fourth light emitters E1 to E4 each have a square shape when viewed in the lamination direction.

Further, in the light emitting apparatus 200, the lattice points G1, at which the first structures 30 are disposed, are arranged in a square lattice, as shown in FIG. 21. That is, the plurality of first structures 30 are arranged in a square lattice. Similarly, the plurality of second structures 32 are arranged in a square lattice. The same holds true for the third structures of the third light emitters E3 and the fourth structures of the fourth light emitters E4.

The arrows in FIG. 23 represent the resonance directions in which the first light resonates in the first light emitters E1. In the case where the plurality of first structures 30 are arranged in a square lattice, the resonance directions are the directions of a fourth axis A4 and a fifth axis A5, which intersect each other at 90°, as shown in FIG. 23.

The plurality of first light emitters E1 are arranged in the resonance directions in which the first light resonates in the first light emitters E1, as shown in FIG. 20. The resonance directions in which the first light resonates in the first light emitters E1 are the following two directions: the direction of the fourth axis A4; and the direction of the fifth axis A5. In the example shown in FIG. 20, a second light emitter E2 is disposed between first light emitters E1 adjacent to each other in the direction of the fourth axis A4. A fourth light emitter E4 is disposed between first light emitters E1 adjacent to each other in the direction of the fifth axis A5. A third light emitter E3 is disposed between fourth light emitters E4 adjacent to each other in the direction of the fourth axis A4.

In the light emitting apparatus 200, the plurality of first structures 30 are arranged in a square lattice and so are the plurality of second structures 32, and the plurality of first light emitters E1 are arranged in a square lattice and so are the plurality of second light emitters E2. In the light emitting apparatus 200, in which the plurality of first structures 30 are arranged in a square lattice, the resonance directions in the first light emitters E1 can be the directions of the fourth axis A4 and the fifth axis A5, which intersect each other at 90°. Further, since the plurality of first light emitters E1 are arranged in a square lattice, the first light emitters E1 can be isotropically disposed with respect to the two resonance directions. Therefore, since a resonator that operates equally for the light that resonates in the two directions can be manufactured, whereby the light confinement per resonance region area can be maximized. The same holds true for the second structures 32 and the second light emitters E2.

2.2 Method for Manufacturing Light Emitting Apparatus

A method for manufacturing the light emitting apparatus 200 according to the second embodiment will next be described. The method for manufacturing the light emitting apparatus 200 according to the second embodiment is basically the same as the method for manufacturing the light emitting apparatus 100 according to the first embodiment described above. No detailed description of the manufacturing method will therefore be described.

2.2 Variation of Light Emitting Apparatus

Figure 24:
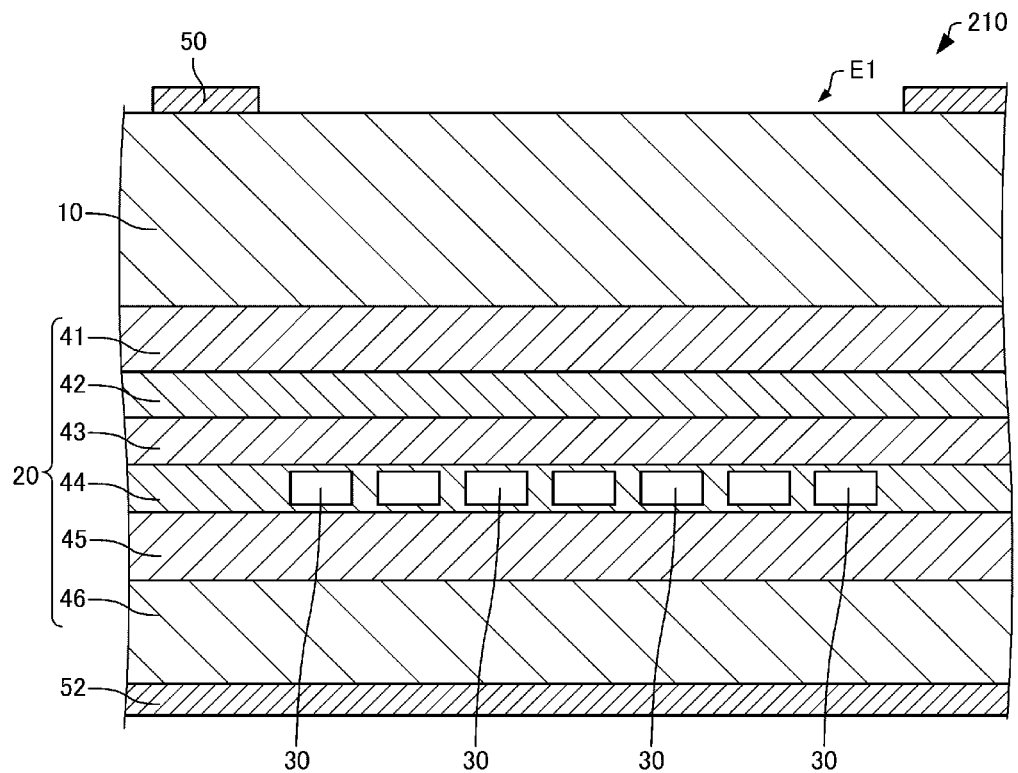
FIG. 24 is a cross-sectional view diagrammatically showing a light emitting apparatus according to a variation of the second embodiment.
Figure 25:
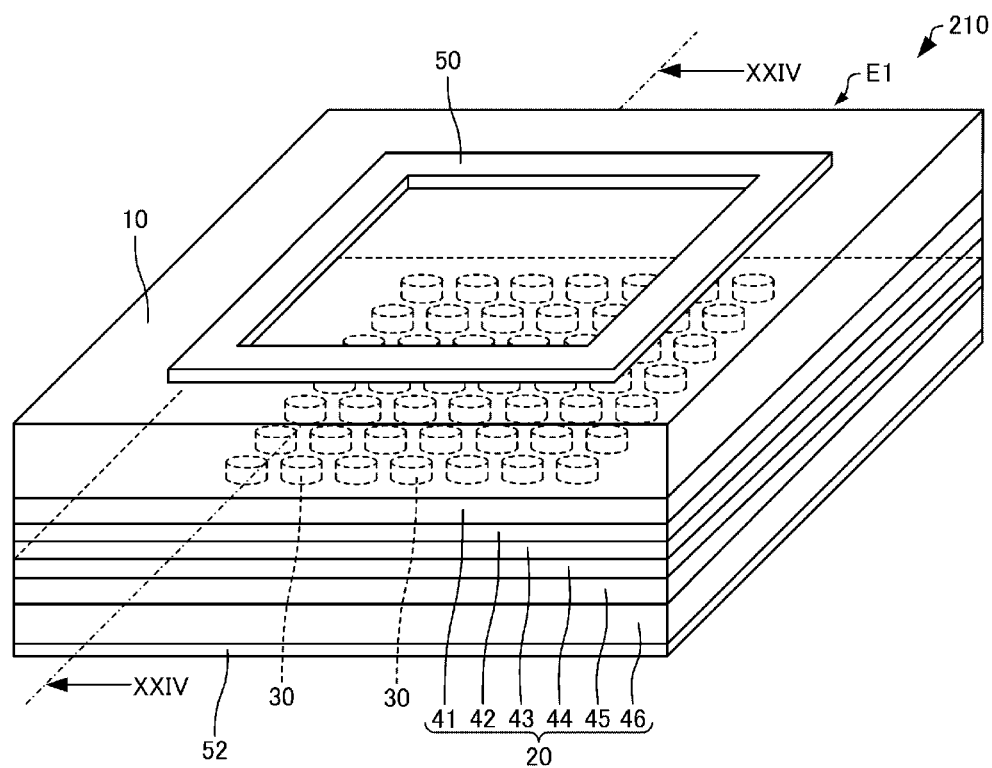
FIG. 25 is a perspective view diagrammatically showing a light emitting apparatus according to the variation of the second embodiment.

A light emitting apparatus according to a variation of the second embodiment will next be described with reference to the drawings. FIG. 24 is a cross-sectional view diagrammatically showing a light emitting apparatus 210 according to the variation of the second embodiment. FIG. 25 is a perspective view diagrammatically showing the light emitting apparatus 210 according to the variation of the second embodiment. FIG. 24 is the cross-sectional view taken along the line XXIV-XXIV in FIG. 25.

The light emitting apparatus 210 according to the variation of the second embodiment will be described below in terms of points different from those of the light emitting apparatus 200 according to the second embodiment described above, and the same points will not be described.

In the light emitting apparatus 200 described above, the first structures 30 are each a columnar portion. In contrast, in the light emitting apparatus 210, the first structures 30 are openings provided in the second guide layer 44, as shown in FIGS. 24 and 25. The second guide layer 44 is a photonic crystal layer provided with a plurality of openings. FIGS. 24 and 25 show the first light emitters E1.

In the light emitting apparatus 210, the first guide layer 42 and the second guide layer 44 may each be a GaN layer. In the example shown in FIGS. 24 and 25, the light emitting apparatus 210 includes a DBR layer 46 provided between the second guide layer 44 and the second electrode 52. The first electrode 50 has a frame-like shape when viewed in the lamination direction. The light emitting apparatus 210 can output a light beam via the base 10.

Figure 26:
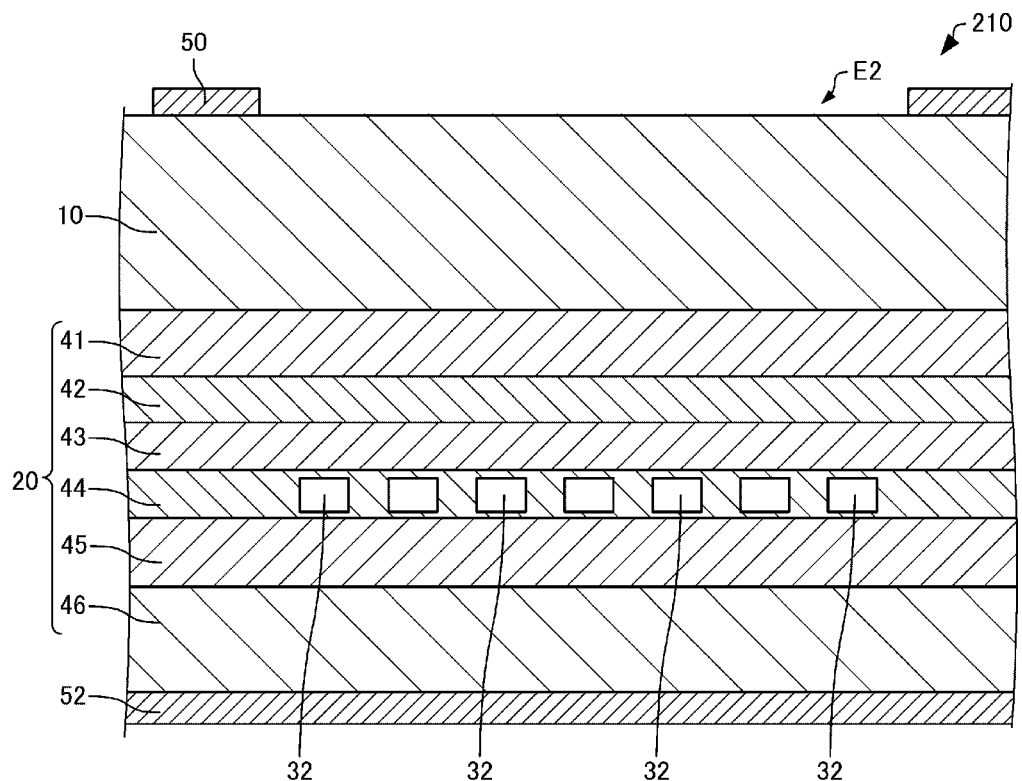
FIG. 26 is a cross-sectional view diagrammatically showing the light emitting apparatus according to the variation of the second embodiment.

The second light emitters E2 will next be described. FIG. 26 is a cross-sectional view diagrammatically showing the second light emitters E2. The second structures 32 of the second light emitters E2 are each, for example, an opening having a radial length smaller than the radial length of the openings of the first structures 30. Similarly, the third structures of the third light emitters E3 and the fourth structures of the fourth light emitters E4 are also openings provided in the second guide layer 44.

As a method for manufacturing the light emitting apparatus 210, the first semiconductor layer 41, the first guide layer 42, the light emission layer 43, and the second guide layer 44 are epitaxially grown in the presented order. The second guide layer 44 is then patterned by photolithography and etching to form, for example, the first structures 30, and then the second guide layer 44 is further grown. The first structures 30, which are each an opening, are thus sealed.

For example, after the DBR layer 46, the second semiconductor layer 44, and the second guide layer 44 are epitaxially grown in the presented order on a base that is not shown, the second guide layer 44 is patterned to form the first structures 30. The member including the first semiconductor layer 41, the first guide layer 42, and the light emission layer 43 formed on the base 10 may then be bonded to the second guide layer 44 provided with the first structures 30 to form the light emitting apparatus 210. The base that is not shown may be removed, for example, before the second electrode 52 is formed.

In the light emitting apparatus 210, the first structures 30 and the second structures 32 are each an opening. The openings are formed, for example, in a patterning process using photolithography and etching. The first structures 30 and the second structures 32 can therefore be readily formed as compared, for example, the case where the first structures 30 and the second structures 32 are each a columnar portion.

In the example shown in FIG. 25, the plurality of first structures 30 are arranged in a square lattice and may instead be arranged in a regular triangular lattice. Similarly, the plurality of second structures 32 may be arranged in a regular triangular lattice. In this case, the plurality of first light emitters E1 may be arranged in a regular triangular lattice and so may the plurality of second light emitters E2.

Although not shown, the first structures 30 may be provided in the first guide layer 42 in place of the second guide layer 44. The same holds true for the second structures 32, the third structures, and the fourth structures.

3. Third Embodiment

Figure 27:
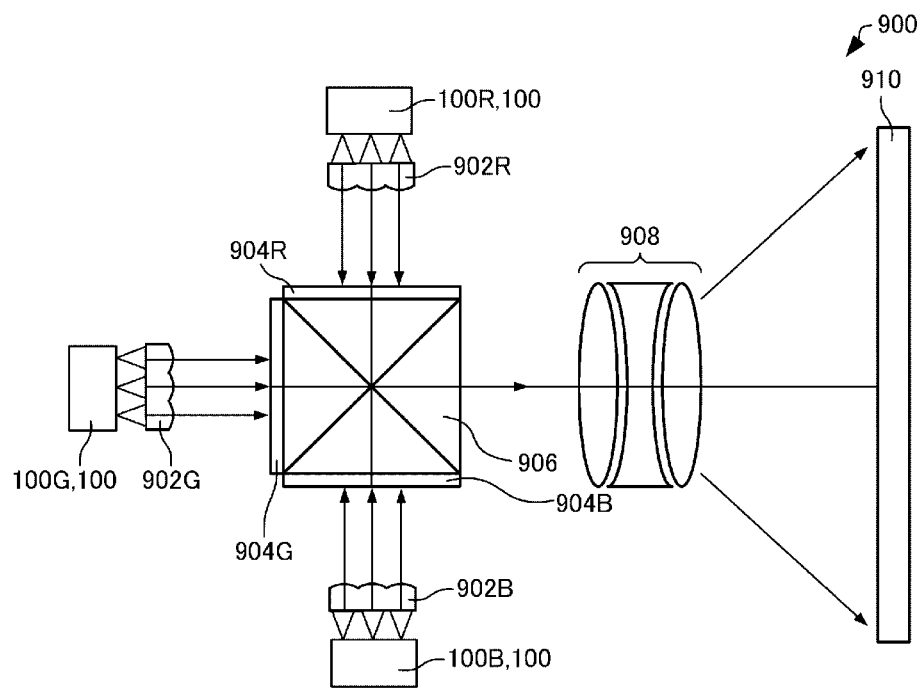
FIG. 27 diagrammatically shows a projector according to a third embodiment.

A projector according to a third embodiment will next be described with reference to the drawings. FIG. 27 diagrammatically shows a projector 900 according to the third embodiment.

The projector according to the embodiment of the present disclosure includes the light emitting apparatus according to one of the embodiments of the present disclosure. The projector 900 including the light emitting apparatus 100 as the light emitting apparatus according to one of the embodiments of the present disclosure will be described below.

The projector 900 includes an enclosure that is not shown and a red light source 100R, a green light source 100G, and a blue light source 100B, which are provided in the enclosure and emit a red light beam, a green light beam, and a blue light beam, respectively. The red light source 100R, the green light source 100G, and the blue light source 100B are formed, for example, of a plurality of light emitting apparatuses 100 disposed in an array arranged in a direction perpendicular to the lamination direction on the base 10 serving as a substrate common to the plurality of light emitting apparatuses 100. The number of light emitting apparatuses 100, which form the red light source 100R, the green light source 100G, and the blue light source 100B, is not limited to a specific value. In FIG. 27, the red light source 100R, the green light source 100G, and the blue light source 100B are simplified for convenience.

The projector 900 further includes a first lens array 902R, a second lens array 902G, a third lens array 902B, a first light modulator 904R, a second light modulator 904G, a third light modulator 904B, and a projection apparatus 908. The first light modulator 904R, the second light modulator 904G, the third light modulator 904B are, for example, each a transmissive liquid crystal light valve. The projection apparatus 908 is, for example, a projection lens.

The light beam emitted from the red light source 100R enters the first lens array 902R. The light beam emitted from the red light source 100R can be collected and, for example, superimposed by the first lens array 902R.

The light beam collected by the first lens array 902R is incident on the first light modulator 904R. The first light modulators 904R modulates the light beam incident thereon in accordance with image information. The projection apparatus 908 enlarges an image formed by the first light modulator 904R and projects the enlarged image on a screen 910.

The light beam emitted from the green light source 100G enters the second lens array 902G. The light beam emitted from the green light source 100G can be collected and, for example, superimposed by the second lens array 902G.

The light beam collected by the second lens array 902G is incident on the second light modulator 904G. The second light modulators 904G modulates the light beam incident thereon in accordance with image information. The projection apparatus 908 enlarges an image formed by the second light modulator 904G and projects the enlarged image on the screen 910.

The light beam emitted from the blue light source 100B enters the third lens array 902B. The light beam emitted from the blue light source 100B can be collected and, for example, superimposed by the third lens array 902B.

The light beam collected by the third lens array 902B is incident on the third light modulator 904B. The third light modulators 904B modulates the light beam incident thereon in accordance with image information. The projection apparatus 908 enlarges an image formed by the third light modulator 904B and projects the enlarged image on the screen 910.

The projector 900 can include a cross dichroic prism 906, which combines the light beams having exited out of the first light modulator 904R, the second light modulator 904G, and the third light modulator 904B with one another and guides the combined light beam to the projection apparatus 908.

The three color light beams modulated by the first light modulator 904R, the second light modulator 904G, the third light modulator 904B enter the cross dichroic prism 906. The cross dichroic prism 906 is formed by bonding four right-angle prisms to each other, and a dielectric multilayer film that reflects the red light beam and a dielectric multilayer film that reflects the blue light beam are disposed in a cross shape on the inner surfaces of the combined prisms. The dielectric multilayer films combine the three color light beams with one another to form a light beam carrying a color image. The combined light beam is then projected by the projection apparatus 908 on the screen 910, whereby an enlarged image is displayed.

The red light source 100R, the green light source 100G, and the blue light source 100B may instead directly form video images without use of the first light modulator 904R, the second light modulator 904G, or the third light modulator 904B by controlling the light emitting apparatuses 100 as the pixels of the video images in accordance with the image information. The projection apparatus 908 may then enlarge and project the video images formed by the red light source 100R, the green light source 100G, and the blue light source 100B on the screen 910.

In the example described above, transmissive liquid crystal valves are used as the light modulators, and light valves based on any other technology other than the liquid crystal technology or reflective light valves may be used. Examples of such light valves may include reflective liquid crystal light valves and digital micromirror devices. The configuration of the projection apparatus is changed as appropriate in accordance with the type of the light valves to be used.

The present disclosure is also applicable to alight source apparatus of a scanning-type image display apparatus including a light source and a scanner that is an image formation apparatus that displays an image having a desired size on a display surface by scanning the screen with the light from the light source.

The application of the light emitting apparatuses according to the embodiments of the present disclosure is not limited to those described in the above embodiments, and the light emitting apparatuses can each be used, for example, as the light source of an indoor or outdoor illuminator, a backlight of a display, a laser printer, a scanner, an in-vehicle light, a sensing instrument using light, and a communication instrument.

Part of the configurations in the embodiments of the present disclosure may be omitted to the extent that the features and effects described in the present application are provided, and the embodiments and variations may be combined with each other.

The present disclosure is not limited to the embodiments described above and can be changed in a variety of manners. For example, the present disclosure encompasses substantially the same configuration as the configuration described in each of the embodiments. The substantially the same configuration is, for example, a configuration having the same function, using the same method, and providing the same result or a configuration having the same purpose and providing the same effect. Further, the present disclosure encompasses a configuration in which an inessential portion of the configuration described in any of the embodiments is replaced. Moreover, the present disclosure encompasses a configuration that provides the same advantageous effect as that provided by the configuration described in any of the embodiments or a configuration that can achieve the same purpose as that achieved by the configuration described in any of the embodiments. Further, the present disclosure encompasses a configuration in which a known technology is added to the configuration described in any of the embodiments.

What is claimed is:
1. A light emitting apparatus comprising:
a plurality of first light emitters; and
a plurality of second light emitters that differ from the first light emitters in terms of resonance wavelength,
wherein the second light emitters are each disposed between each adjacent pair of the first light emitters,
first light that resonates in the plurality of first light emitters is in phase, and second light that resonates in the plurality of second light emitters is in phase.

2. The light emitting apparatus according to claim 1, wherein the plurality of first light emitters are arranged in directions in which the first light resonates, and the plurality of second light emitters are arranged in directions in which the second light resonates.

3. The light emitting apparatus according to claim 1, wherein the first light emitters and the second light emitters each include a light emission layer.

4. The light emitting apparatus according to claim 1, wherein the first light emitter includes a plurality of first structures, the plurality of first structures are periodically arranged, the second light emitter includes a plurality of second structures, the plurality of second structures are periodically arranged, the first structures are each a columnar portion, and the second structures are each a columnar portion.

5. The light emitting apparatus according to claim 1, wherein the first light emitter includes a plurality of first structures, the plurality of first structures are periodically arranged, the second light emitter includes a plurality of second structures, the plurality of second structures are periodically arranged, the first structures are each an opening, and the second structures are each an opening.

6. The light emitting apparatus according to claim 4, wherein the plurality of first structures are arranged in a regular triangular lattice and the plurality of second structures are arranged in a regular triangular lattice, and the plurality of first light emitters are arranged in a regular triangular lattice and the plurality of second light emitters are arranged in a regular triangular lattice.

7. The light emitting apparatus according to claim 4, wherein the plurality of first structures are arranged in a square lattice and the plurality of second structures are arranged in a square lattice, and the plurality of first light emitters are arranged in a square lattice and the plurality of second light emitters are arranged in a square lattice.

8. The light emitting apparatus according to claim 1, wherein a distance between adjacent pair of the first light emitters is a distance that allows the first light that resonates in one of adjacent first light emitters to couple with the first light that resonates in another of adjacent first light emitters, and a distance between adjacent pair of the second light emitters is a distance that allows the second light that resonates in one of adjacent second light emitters to couple with the second light that resonates in another of adjacent second light emitters.

9. A projector comprising the light emitting apparatus according to claim 1.

* * * * *